(12) United States Patent
Li et al.

(10) Patent No.: US 9,356,335 B2
(45) Date of Patent: May 31, 2016

(54) ELECTROPHORETIC DISPLAY DEVICE HAVING INTEGRATED NFC ANTENNA

(71) Applicant: Truly Semiconductors Ltd., Guangdong (CN)

(72) Inventors: Jianhua Li, Guangdong (CN); Dongyue Wang, Guangdong (CN); Hangchao Mao, Guangdong (CN); Yongchao Liang, Guangdong (CN); Ganxiang Li, Guangdong (CN); Xuebin Chen, Guangdong (CN)

(73) Assignee: TRULY SEMICONDUCTORS LTD., Shanwei, Guangdong (CN)

( * ) Notice: Subject to any disclaimer, the term of this patent is extended or adjusted under 35 U.S.C. 154(b) by 0 days.

(21) Appl. No.: 14/389,328

(22) PCT Filed: Feb. 6, 2013

(86) PCT No.: PCT/CN2013/071429
§ 371 (c)(1),
(2) Date: Sep. 29, 2014

(87) PCT Pub. No.: WO2013/149516
PCT Pub. Date: Oct. 10, 2013

(65) Prior Publication Data
US 2015/0085344 A1   Mar. 26, 2015

(30) Foreign Application Priority Data

Apr. 6, 2012   (CN) .................... 2012 2 0145136 U
Jul. 6, 2012   (CN) .......................... 2012 1 0236152

(51) Int. Cl.
*G02B 26/00*   (2006.01)
*G02F 1/133*   (2006.01)
(Continued)

(52) U.S. Cl.
CPC ............ *H01Q 1/2283* (2013.01); *G02F 1/1368* (2013.01); *G02F 1/13306* (2013.01);
(Continued)

(58) Field of Classification Search
CPC ............................. G02B 26/026; G02B 26/001
USPC ......... 359/296, 245, 253–254, 290–291, 298; 349/33; 345/49, 105, 107; 430/31–32
See application file for complete search history.

(56) References Cited

U.S. PATENT DOCUMENTS

2008/0158217 A1   7/2008 Hata et al.
2011/0140841 A1*  6/2011 Bona et al. ................... 340/5.83
(Continued)

FOREIGN PATENT DOCUMENTS

CN   2696070 Y   4/2005
CN   1622391 A   6/2005
(Continued)

OTHER PUBLICATIONS

ISR dated Feb. 5, 2013 for Application No. PCT/CN2013/071429.

*Primary Examiner* — Dawayne A Pinkney
(74) *Attorney, Agent, or Firm* — Knobbe Martens Olson & Bear LLP

(57) ABSTRACT

The present invention relates to near field communication technology. Specifically, disclosed is an electrophoretic display device having integrated an NFC antenna. The NFC antenna is arranged on a display screen of the electrophoretic display device, where the NFC interface is equipped with an output circuit of the display screen and is connected to a control mainboard of the display screen. The present invention combines the display screen and NFC antenna features into one, and has the NFC antenna provided directly on the electrophoretic display device, thus preventing the problem of signal quality deterioration and reception failure due to wearing of the NFC antenna interface and inaccurate alignment. In addition, a solution is provided for facilitating reception of an NFC signal from a display panel of the display device or for when the NFC signal must be received from the display panel of the display device.

11 Claims, 3 Drawing Sheets

(51) Int. Cl.
- *G09G 3/34* (2006.01)
- *G03G 17/04* (2006.01)
- *H01Q 1/22* (2006.01)
- *H01Q 1/44* (2006.01)
- *H01Q 7/00* (2006.01)
- *H01Q 1/40* (2006.01)
- *H01Q 1/50* (2006.01)
- *H05B 33/08* (2006.01)
- *H01L 27/32* (2006.01)
- *H04B 5/00* (2006.01)
- *G02F 1/1333* (2006.01)
- *G02F 1/1335* (2006.01)
- *G02F 1/1368* (2006.01)
- *H05K 1/18* (2006.01)
- *G02F 1/167* (2006.01)
- *H01L 27/12* (2006.01)

(52) U.S. Cl.
CPC ...... *G02F1/13338* (2013.01); *G02F 1/133345* (2013.01); *G02F 1/133512* (2013.01); *G02F 1/133514* (2013.01); *G02F 1/167* (2013.01); *G09G 3/344* (2013.01); *H01L 27/124* (2013.01); *H01L 27/323* (2013.01); *H01L 27/3225* (2013.01); *H01Q 1/22* (2013.01); *H01Q 1/2258* (2013.01); *H01Q 1/2266* (2013.01); *H01Q 1/40* (2013.01); *H01Q 1/44* (2013.01); *H01Q 1/50* (2013.01); *H01Q 7/00* (2013.01); *H04B 5/0081* (2013.01); *H05B 33/0896* (2013.01); *H05K 1/181* (2013.01); *H05K 1/189* (2013.01); *G09G 2370/00* (2013.01); *H05K 2201/10098* (2013.01); *H05K 2201/10151* (2013.01)

(56) References Cited

U.S. PATENT DOCUMENTS

| | | | |
|---|---|---|---|
| 2012/0109735 | A1 | 5/2012 | Krawczewicz et al. |
| 2012/0181333 | A1 | 7/2012 | Krawczewicz et al. |
| 2012/0217303 | A1 | 8/2012 | Krawczewicz et al. |
| 2013/0187833 | A1* | 7/2013 | Kim .............................. 345/1.3 |
| 2014/0375310 | A1* | 12/2014 | Greuet et al. ................. 324/244 |

FOREIGN PATENT DOCUMENTS

| | | |
|---|---|---|
| CN | 1737830 A | 2/2006 |
| CN | 101211552 A | 7/2008 |
| CN | 101848296 A | 9/2010 |
| CN | 102076121 A | 5/2011 |
| CN | 102214029 A | 10/2011 |
| CN | 202014259 U | 10/2011 |
| CN | 202068693 U | 12/2011 |
| CN | 102750885 A | 10/2012 |

* cited by examiner

ELECTROPHORETIC DISPLAY DEVICE HAVING INTEGRATED NFC ANTENNA

This application is a National Stage application of PCT international application PCT/CN2013/071429, filed on Feb. 6, 2013 which claims priority to Chinese Patent Application No. 201220145136.8, entitled "DISPLAY SCREEN", filed with the Chinese Patent Office on Apr. 6, 2012, and Chinese Patent Application No. 201210236152.2, entitled "ELECTROPHORETIC DISPLAY DEVICE INTEGRATED WITH NFC ANTENNA", filed with the Chinese Patent Office on Jul. 6, 2012, which are incorporated by reference in their entireties herein.

FIELD OF THE TECHNOLOGY

The present application relates to the field of near field communication technology, particularly to an electrophoretic display integrated with an NFC antenna.

BACKGROUND

Near Field Communication (NFC) technology is a necessary technology for future electronic products, which may be applied widely. Most antennae of existing NFC products are fabricated at one side of a battery or attached inside a casing, generally by forming coils with metal wirings on a Printed Circuit Board (PCB) or on a Flexible Printed Circuit (FPC) and then attaching the PCB or the FPC with the coils to the battery or the casing. Disadvantages of the existing NFC products mainly include the followings. Due to repeated mounting and dismounting of the battery and the casing, abrasion or misalignment is easy to occur at a wiring junction of the NFC antenna, and thus a signal of the antenna is deteriorated and functions of the NFC product can not be used effectively. In addition, the antenna of the NFC product is usually located inside the casing of the electronic product. If a metallic material is selected to fabricate the casing, propagation of NFC signals may be affected. Therefore, sturdy metallic materials are limited when selecting a material for the casing of an electronic product.

For example, many electronic products equipped with an NFC antenna and an Electrophoretic Display (EPD) have the above problems. The electrophoretic display is a non-emissive device based on electrophoresis phenomenon of charged pigment particles suspended in a colored intermediate solvent. The electrophoretic display may include a pair of opposite plate-shaped electrodes spaced from each other; and a spacer provided between the two electrodes, which is configured to determine a distance. At least one electrode (usually an electrode on a viewing side) is transparent. When a voltage difference is applied across the two electrodes, the pigment particles are migrated due to an attraction caused by the electrode plates with opposite polarities. Whether a color of the pigment particles or a color of the solvent is seen from the viewing side is determined from the voltage selectively applied across the electrodes. If polarities of the two electrode plates are inverted, the pigment particles will be migrated to an opposite electrode, and then the color is inverted. A color depth (shade of gray) of the intermediate is determined by a chroma of the color at the side of the transparent plate, which can be achieved by controlling a range of the voltage between the plates and a period of a pulse.

An electronic product equipped with an NFC antenna and an electrophoretic display has an unreasonable arrangement of the NFC antenna. Abrasion and misalignment are easy to occur at the wiring junction. As a result, a signal of the antenna is deteriorated. In addition, a selection range of the casing of the electronic product is limited. However, it is possible to integrate an NFC antenna during fabrication of an electrophoretic display. In view of this, it is necessary to design a new electrophoretic display integrated with an NFC antenna, to solve the above problems.

SUMMARY

In view of this, an electrophoretic display integrated with an NFC antenna is provided according to the application, which may prevent an abrasion and a misalignment at a wiring junction of the antenna and ensure the quality of signals of the antenna. In addition, an electronic product equipped with the above electrophoretic display transmits signals from a display surface, and thereby a selection of materials for a casing is not limited by the NFC antenna.

To solve the above technical problems, a technical solution is provided in the application, including: an electrophoretic display integrated with an NFC antenna, where the NFC antenna is disposed on a screen of the electrophoretic display, and an NFC interface is built in an output circuit of the screen and is connected to a control board of the screen.

Preferably, the display includes in turn: a protective film layer, an electrophoretic display film layer, and a driving board layer, where the NFC antenna is led to an output circuit of the driving board of the screen via a conductive material.

Preferably, the NFC antenna is disposed at an inner side or an outer side of the protective film of the screen, and is connected to an output circuit of the driving board of the screen via a conductive material.

Preferably, the NFC antenna is disposed at a side, closer to the driving board, of the electrophoretic display film of the screen, or is disposed at a periphery of the electrophoretic display film of the screen, and is connected to an output circuit of the driving board of the screen via a conductive material.

Preferably, the NFC antenna is connected to the output circuit of the driving board of the screen via the conductive material, such as a conductive silver paste.

Preferably, the NFC antenna is disposed at an outer side of the driving board of the screen, and a protective layer is disposed outside the NFC antenna.

Preferably, the driving board is a printed circuit board, a flexible circuit board, a thin film field effect transistor array board, indium tin oxide glass, or an indium tin oxide plastic board.

Preferably, the NFC antenna is a multi-turn coil including wirings made of a conductive material.

Preferably, the NFC antenna adopts wirings of low resistivity material including silver, copper or aluminum.

Preferably, the multi-turn coil is wound into a rectangle, a round shape, or an annular shape matching a contour of the electrophoretic display.

Preferably, a side, closer to an interior of the display, of the multi-turn coil is covered with a layer of transparent ferrite material.

In contrast to the existing technology, in the electrophoretic display integrated with the NFC antenna according to this application, the NFC antenna is disposed directly on the electrophoretic display. An NFC interface is built in an output circuit of the screen and is connected to a control board. The NFC antenna is connected fixedly after the installation, which thus will not be mounted and dismounted frequently. Thereby, conventional problems that a signal is deteriorated and a reception of the signal fails in the existing NFC antenna due to the abrasion and misalignment of the interface are avoided. Further, solutions are provided for convenience of receiving NFC signals from a display surface of the display, or if it is necessary to receive NFC signals from a display surface of the display. In addition, an electronic product equipped with the above electrophoretic display transmits signals from the display surface, and thus the selection of material for the casing is not limited by the NFC antenna.

REFERENCE NUMERALS IN FIG. 1a-FIG. 5

1. protective film (layer); 2. electrophoretic display film (layer); 3. driving board (layer); 4. glue; 5. NFC antenna; 6. conductive silver paste; 7. protective layer.

DETAILED DESCRIPTION OF THE EMBODIMENTS

In a basic concept of the application, an NFC antenna is disposed on a screen of an electrophoretic display, where an NFC interface is built in an output circuit of the screen, and is connected to a control board of the screen.

For better understanding of the technical solution of the application by those skilled in the art, the application is further described below in detail with a combination of drawings and embodiments.

First Embodiment

Figure 1A:
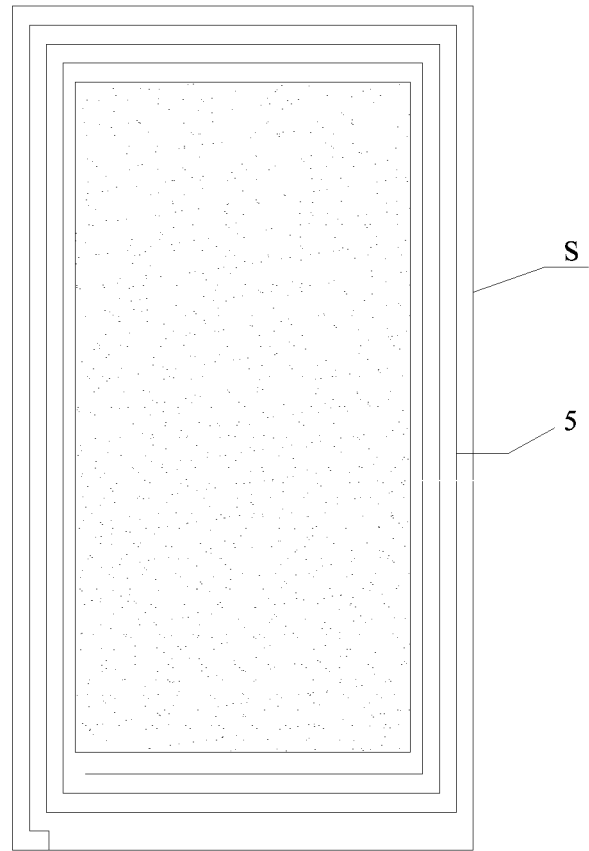
FIG. 1a is a front view of an installation position of an NFC antenna on an electrophoretic display in a first embodiment of an electrophoretic display integrated with an NFC antenna according to the application.
Figure 1B:
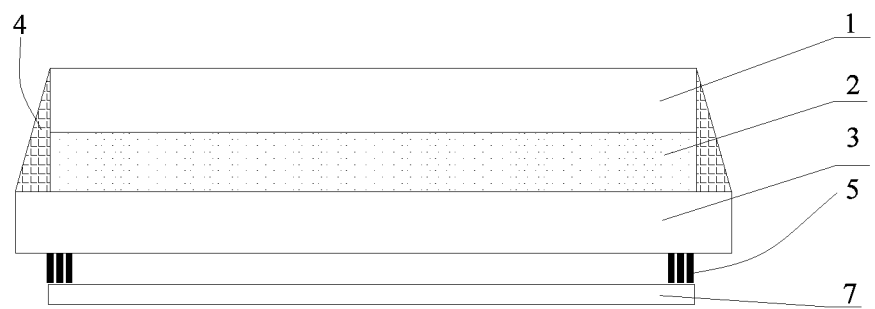
FIG. 1b is a diagram of an installation structure of an NFC antenna in a first embodiment of an electrophoretic display integrated with an NFC antenna according to the application.

Referring to both FIG. 1a and FIG. 1b, an installation structure of an NFC antenna in the first embodiment of an electrophoretic display integrated with an NFC antenna according to the application is shown. A screen S of the electrophoretic display integrated with the NFC antenna includes: a protective film 1, an electrophoretic display film (EPD film) 2 and a driving board 3. The driving board 3 is one of a PCB, an FPC, a thin film field effect transistor (TFT) array, indium tin oxide (ITO) glass, and an ITO plastic board. Surrounding edges of the protective film 1 and the driving board 3 are sealed with glue 4, to form an accommodation space to be filled with the electrophoretic display film 2. The NFC antenna 5 is disposed at an outer side of the driving board 3, and a protective layer 7 is disposed outside the NFC antenna 5.

The NFC antenna 5 is disposed at an outer side of the driving board 3 of the screen, as shown in FIG. 1b. A multi-turn coil is made with wirings of metallic material (such as silver, copper or aluminum) or other low resistivity material (such as carbon) on the driving board 3 (a PCB, an FPC, a TFT array, ITO glass, or an ITO plastic board, etc.) of the screen of the electrophoretic display. The multi-turn coil is wound into a rectangle, a round shape, or an annular shape matching contour of the display product. A side, closer to an interior of the display, of the multi-turn coil is covered with a layer of transparent ferrite material to enhance magnetic induction intensity. This kind of wiring can be achieved with existing devices without additional investment.

In addition, an antenna matching circuit (not shown in the figures) connected with the NFC antenna 5 is provided. The antenna matching circuit includes a charge and discharge module and an impedance module. The charge and discharge module is connected to the impedance module. The charge and discharge module includes capacitors in parallel or in series; and the impedance module includes resistors in parallel or in series. Thereby, a power matching of the NFC antenna 5 is achieved by disposing the antenna matching circuit.

Second Embodiment

Figure 2:
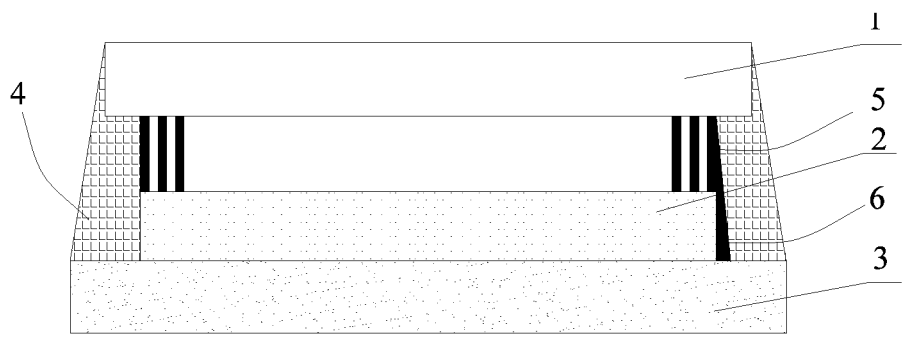
FIG. 2 is a diagram of an installation structure of an NFC antenna in a second embodiment of an electrophoretic display integrated with an NFC antenna according to the application.

Referring to FIG. 2, an installation structure of an NFC antenna in the second embodiment of an electrophoretic display integrated with an NFC antenna according to the application is shown. The NFC antenna 5 is disposed at an inner side of a protective film 1 of the screen, i.e., between the protective film 1 and an electrophoretic display film 2. The NFC antenna is electrically connected to an output circuit of a driving board 3 of the screen. Particularly, the NFC antenna is connected to the output circuit of the driving board via a conductive silver paste 6 or other conductive material disposed at a side of the electrophoretic display film. Other part of the structure is same to that in the first embodiment, which will not be repeated herein.

Third Embodiment

Figure 3:
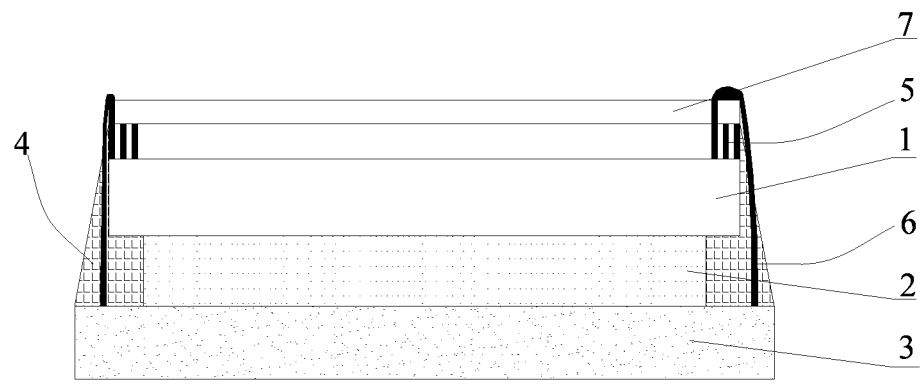
FIG. 3 is a diagram of an installation structure of an NFC antenna in a third embodiment of an electrophoretic display integrated with an NFC antenna according to the application.

Referring to FIG. 3, an installation structure of an NFC antenna in the third embodiment of an electrophoretic display integrated with an NFC antenna according to the application is shown. The NFC antenna 5 is disposed at an outer side of a protective film 1 of the screen. A protective layer 7 is disposed outside the NFC antenna 5. The NFC antenna 5 is connected to an output circuit of the driving board 3 via a conductive silver paste 6. Other part of the structure is same to that in the first embodiment or the second embodiment, which will not be repeated herein.

Fourth Embodiment

Figure 4:
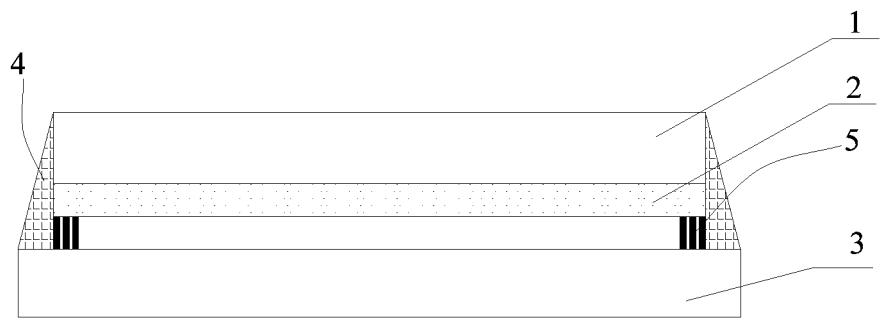
FIG. 4 is a diagram of an installation structure of an NFC antenna in a fourth embodiment of an electrophoretic display integrated with an NFC antenna according to the application.

Referring to FIG. 4, an installation structure of an NFC antenna in the fourth embodiment of an electrophoretic display integrated with an NFC antenna according to the application is shown. In the fourth embodiment, the NFC antenna 5 is disposed at a side, closer to a driving board, of an electrophoretic display film 2 of the screen. The NFC antenna 5 is directly connected to an output circuit 3 of the driving board of the screen (without a conductive silver paste 6 or other material). Other part of the structure is same to that in the first embodiment, which will not be repeated herein.

Fifth Embodiment

Figure 5:
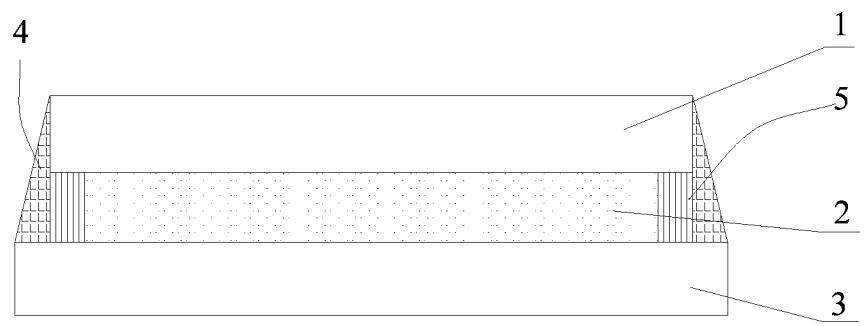
FIG. 5 is a diagram of an installation structure of an NFC antenna in a fifth embodiment of an electrophoretic display integrated with an NFC antenna according to the application.

Referring to FIG. 5, an installation structure of an NFC antenna in the fifth embodiment of an electrophoretic display integrated with an NFC antenna according to the application is shown. In the fifth embodiment, the NFC antenna 5 is disposed at a periphery of an electrophoretic display film 2 of the screen. The NFC antenna 5 is connected to an output circuit of a driving board 3 of the screen via a conductive material. Other part of the structure is same to that in the fourth embodiment, which will not be repeated herein.

In the above embodiments, the NFC antenna is disposed directly on the electrophoretic display. An NFC interface of the NFC antenna in built in an output circuit of the screen and is connected to a control board (not shown in the figures). The NFC antenna is connected fixedly after the installation, which thus will not be mounted and dismounted frequently. Therefore, a conventional problem that a failure of reception is caused by abrasion or misalignment of the interface in the existing NFC antenna is avoided. Further, solutions are provided for convenience of receiving NFC signals from a display surface of the display, or if it is necessary to receive NFC signals from a display surface of the display. In addition, an electronic product equipped with the above electrophoretic display transmits signals from the display surface, and thus the selection of material for the casing is not limited by the NFC antenna.

In the electrophoretic display integrated with the NFC antenna according to the application, the screen and the NFC antenna are integrated together, which is more competitive in markets.

Hereinbefore are merely preferable embodiments of the application. Note that, the aforesaid preferable embodiments should not be regarded as limitation to the application. A scope of the application is subject to the scope limited by the appended claims. For those skills in the art, improvements or retouches may be performed without departing from the spirit and scope of the application. These improvements and retouches should be regarded within the scope of the application.

What is claimed is:

1. An electrophoretic display integrated with a Near Field Communication (NFC) antenna, wherein the electrophoretic display comprises in following sequence as listed below: a protective film layer, an electrophoretic display film layer, and a driving board layer, the NFC antenna is disposed:
    on each side of the electrophoretic display film layer,
    at a periphery of the electrophoretic display film layer,
    on a side of the protective film layer, which faces away from the electrophoretic display film layer, or
    on a side of the driving board layer, which faces away from the electrophoretic display film layer,
    and wherein an NFC interface is built in an output circuit of the screen and is connected to a control board of the screen.

2. The electrophoretic display integrated with the NFC antenna according to claim 1, wherein the NFC antenna is led to an output circuit of the driving board of the screen via a conductive material.

3. The electrophoretic display integrated with the NFC antenna according to claim 2, wherein the NFC antenna is connected to the output circuit of the driving board of the screen via a conductive silver paste.

4. The electrophoretic display integrated with the NFC antenna according to claim 2, wherein a protective layer is disposed outside the NFC antenna in the case that the NFC antenna is disposed on the side of the driving board layer, which faces away from the electrophoretic display film layer.

5. The electrophoretic display integrated with the NFC antenna according to claim 2, wherein the driving board is a printed circuit board, a flexible circuit board, a thin film field effect transistor array, indium tin oxide glass, or an indium tin oxide plastic board.

6. The electrophoretic display integrated with the NFC antenna according to claim 1, wherein the NFC antenna is a multi-turn coil comprising wirings made of a conductive material.

7. The electrophoretic display integrated with the NFC antenna according to claim 6, wherein the multi-turn coil is wound into an annular shape matching a contour of the electrophoretic display.

8. The electrophoretic display integrated with the NFC antenna according to claim 6, wherein a side, closer to an interior of the display, of the multi-turn coil is covered with a layer of transparent ferrite material.

9. The electrophoretic display integrated with the NFC antenna according to claim 6, wherein the NFC antenna adopts wirings of low resistivity material comprising silver, copper, and aluminum.

10. The electrophoretic display integrated with the NFC antenna according to claim 7, wherein a side, closer to an interior of the display, of the multi-turn coil is covered with a layer of transparent ferrite material.

11. The electrophoretic display integrated with the NFC antenna according to claim 7, wherein the NFC antenna adopts wirings of low resistivity material comprising silver, copper, and aluminum.

* * * * *